United States Patent
Shinmyo

(10) Patent No.: US 8,063,696 B2
(45) Date of Patent: Nov. 22, 2011

(54) RECEIVING CIRCUIT AND RECEIVING SYSTEM

(75) Inventor: Akinori Shinmyo, Hyogo (JP)

(73) Assignee: Panasonic Corporation, Osaka (JP)

( * ) Notice: Subject to any disclaimer, the term of this patent is extended or adjusted under 35 U.S.C. 154(b) by 254 days.

(21) Appl. No.: 12/597,885

(22) PCT Filed: Feb. 2, 2009

(86) PCT No.: PCT/JP2009/000386
§ 371 (c)(1),
(2), (4) Date: Oct. 27, 2009

(87) PCT Pub. No.: WO2010/041352
PCT Pub. Date: Apr. 15, 2010

(65) Prior Publication Data
US 2011/0210771 A1 Sep. 1, 2011

(30) Foreign Application Priority Data
Oct. 8, 2008 (JP) .................................. 2008-262141

(51) Int. Cl.
*G06G 7/12* (2006.01)
(52) U.S. Cl. .......................................... 327/563; 327/52
(58) Field of Classification Search .................... 327/52, 327/560–563, 109–111
See application file for complete search history.

(56) References Cited

U.S. PATENT DOCUMENTS

| | | | |
|---|---|---|---|
| 6,211,721 B1 | 4/2001 | Smetana | |
| 6,515,518 B1 | 2/2003 | Minegishi | |
| 6,707,321 B2 * | 3/2004 | Cho et al. | 327/51 |
| 6,760,349 B1 | 7/2004 | Ho et al. | |
| 7,405,622 B2 | 7/2008 | Nishimura et al. | |
| 7,622,986 B2 * | 11/2009 | Pan et al. | 327/563 |
| 7,786,764 B2 * | 8/2010 | Cheng | 327/72 |

FOREIGN PATENT DOCUMENTS

| | | |
|---|---|---|
| JP | 05-114846 | 5/1992 |
| JP | 04-170814 | 6/1992 |
| JP | 5-31361 | 4/1993 |
| JP | 10-285006 | 10/1998 |
| JP | 2001-168692 | 6/2001 |
| JP | 2007-274428 | 10/2007 |
| WO | WO 2007/114265 | 10/2007 |

* cited by examiner

*Primary Examiner* — Hai L Nguyen
(74) *Attorney, Agent, or Firm* — McDermott Will & Emery LLP

(57) ABSTRACT

An output circuit (12) converts a pair of current signals supplied to a pair of common nodes (NCa and NCb) into a pair of voltage signals (VOa and VOb). In each of input buffer circuits (11, 11, ...), a constant current generation section (101) generates, in an output mode, a pair of constant currents in a pair of current paths going from a pair of intermediate nodes (NMa and NMb) to a reference node (VDD1), and stops the generation of the pair of constant currents in a cutoff mode. A voltage-to-current conversion section (102) generates, in the output mode, a pair of input currents corresponding to a pair of input signals (Sa and Sb) in a pair of current paths going from the pair of intermediate nodes (NMa and NMb) to a reference node (GND) to thereby generate a pair of current signals (Ia and Ib) in a pair of current paths going from the pair of intermediate nodes (NMa and NMb) to the pair of common nodes (NCa and NCb), and stops the generation of the pair of input currents in the cutoff mode.

13 Claims, 14 Drawing Sheets

US 8,063,696 B2

RECEIVING CIRCUIT AND RECEIVING SYSTEM

RELATED APPLICATIONS

This application is the U.S. National Phase under 35 U.S.C. §371 of International Application No. PCT/JP2009/000386, filed on Feb. 2, 2009, which in turn claims the benefit of Japanese Application No. 2008-262141, filed on Oct. 8, 2008, the disclosures of which Applications are incorporated by reference herein.

TECHNICAL FIELD

The present invention relates to a receiving circuit that selectively receives one of multiple input signals.

BACKGROUND ART

In recent years, as video quality and audio quality have improved, the amount of information transmitted between devices has been growing. Correspondingly, there is a demand for an increase in signal transmission speed between devices. For example, to display a moving image on a panel with a pixel count of 1920×1080 in a display device that is in compliance with the HDMI (High Definition Multimedia Interface) standard, it is necessary to transmit and receive signals at about 750 Mbps in interlaced scanning, and at twice the speed, about 1.5 Gbps, in progressive scanning. To achieve such ultrahigh speed transmission and reception exceeding several Gbps, the receivable band of the receiving device (i.e., the frequency band in which the receiving device can receive an input signal correctly) needs to be set to several GHz or higher, and signal attenuation in the receiving device needs to be minimized.

Also, in recent years, it has been necessary to perform many-to-one communications by connecting multiple transmitting devices with a single receiving device, as shown in FIG. 12. For example, it may be required for a DVD recorder, a digital video camera, and a projector to be separately connected to three input ports of display equipment, and that one of these devices be selected to display an image. In FIG. 12, transmitter LSIs 81 included in transmitting devices 8, 8, ... are connected with a receiver LSI 90 in a receiving device 9 through transmission paths. In the receiving device 9, the signal paths going from the transmission paths to the receiver LSI 90 are provided with terminating resistors R90. The receiver LSI 90 selectively receives a signal from one of the transmitting devices 8, 8, ... in response to a selection signal SEL.

FIG. 13 shows the configuration of a conventional receiving circuit capable of such many-to-one communications. This receiving circuit includes input buffer circuits 91, 91, ... corresponding to differential signals (input signals Sa and Sb) transmitted from transmitting devices, and includes a selector 92.

In one of the input buffer circuits 91, 91, ... that has been supplied with a selection signal SEL, a signal selection section 901 drives a voltage-to-current conversion section 902, the voltage-to-current conversion section 902 converts the differential signal (the input signals Sa and Sb) into a pair of currents, and a load resistor 903 converts the pair of currents obtained by the voltage-to-current conversion section 902 into voltage signals V91a and V91b.

The selector 92 includes signal input sections 904, 904, ..., which correspond to the input buffer circuits 91, 91, ..., a load resistor 905, and a constant current source 913.

In one of the signal input sections 904, 904, ... that has been supplied with the selection signal SEL, a pair of cascode transistors (911a and 911b) turn on, causing a pair of input transistors (912a and 912b) to convert the pair of voltage signals V91a and V91b from the input buffer circuit 91 into a pair of currents. The load resistor 905 converts the pair of currents obtained by the pair of input transistors (912a and 912b) into voltage signals VOa and VOb. In this way, it is possible to selectively receive one of the differential signals (the input signals Sa and Sb) by supplying the selection signal SEL to one of the input buffer circuits 91, 91, ... and to the signal input section 904 corresponding to that input buffer circuit 91. It should be noted that Patent Documents 1 and 2 also disclose the configuration of the selector 92.

FIG. 14 shows the configuration of a receiver LSI that includes the receiving circuit shown in FIG. 13. In this receiver LSI, the input ports 0, 1, and 2 each include four data channels. In each input port, four input buffer circuits 91, 91x, 91y, and 91z are arranged according to the arrangement of eight I/O cells. The input buffer circuits 91, 91 and 91 formed in the input ports 0, 1, and 2 are connected with a selector 92 through separate pairs of lines. The respective connection relationships between the input buffer circuits 91x and a selector 92x, between the input buffer circuits 91y and a selector 92y, and between the input buffer circuits 91z and a selector 92z are the same as those between the input buffer circuits 91 and the selector 92, and the illustration thereof is thus omitted.

Patent Document 1: Japanese Laid-Open Publication No. 10-285006

Patent Document 1: Japanese Laid-Open Publication No. 2001-168692

DISCLOSURE OF THE INVENTION

Problem that the Invention Intends to Solve

In the conventional receiving circuit, however, the lines that connect the input buffer circuits with the selector vary in length from one input buffer circuit to another. As the line connecting each input buffer circuit with the selector is increased, the load (the parasitic line capacitance and the parasitic line resistance) applied to the output terminal of that input buffer circuit increases, thereby limiting the receivable band. This causes variations in frequency characteristics among the input buffer circuits, resulting in a failure to achieve stable reception. For example, a phenomenon occurs in which a certain input signal can be correctly received, however, when the signal to be received is switched to another input signal, this new input signal cannot be received correctly.

In view of this, it is an object of the present invention to provide a receiving circuit in which variations in frequency characteristics among input buffer circuits is reduced.

Means for Solving the Problem

According to an aspect of the invention, a receiving circuit for selectively receiving one pair of a plurality of pairs of input signals includes: a plurality of input buffer circuits, each supplied with one pair of the pairs of input signals and each being switchable between an output mode and a cutoff mode, each of the input buffer circuits supplying, in the output mode, to a pair of common nodes a pair of current signals corresponding to the pair of input signals supplied to that input buffer circuit, and stopping the supply of the pair of current signals in the cutoff mode; and an output circuit configured to convert the pair of current signals supplied to the pair of common nodes into a pair of voltage signals. Each of the input buffer circuits includes a first constant current generation section configured to generate, in the output mode, a pair of constant currents in a pair of current paths going from a pair of intermediate nodes to a first reference node, and stopping the generation of the pair of constant currents in the cutoff mode, the pair of intermediate nodes being connected with the pair of common nodes; and a voltage-to-current conversion section configured to generate, in the output mode, a pair of input currents corresponding to the pair of input signals supplied to that input buffer circuit in a pair of current paths going from the pair of intermediate nodes to a second reference node to thereby generate the pair of current signals in a pair of current paths going from the pair of intermediate nodes to the pair of common nodes, and stopping the generation of the pair of input currents in the cutoff mode. In the receiving circuit, the pairs of intermediate nodes in the input buffer circuits are all connected with the pair of common nodes in the output circuit. Thus, the loads applied to the pairs of intermediate nodes in the input buffer circuits are equalized regardless of where the input buffer circuits are arranged, thereby reducing variation in frequency characteristics among the input buffer circuits.

Each of the input buffer circuits preferably further includes a pair of input transistors formed in the pair of current paths going from the pair of intermediate nodes of that input buffer circuit to the pair of common nodes, the pair of input transistors having a pair of gates to which a first bias voltage is supplied. This configuration suppresses voltage variation at the pairs of intermediate nodes, thereby allowing each first constant current generation section to supply the constant currents accurately.

Each of the input buffer circuits preferably further includes a first voltage generation section configured to supply, in the output mode, the first bias voltage to the pair of gates of the pair of input transistors, and stopping the supply of the first bias voltage in the cutoff mode. This configuration prevents noise from each input buffer circuit being in the cutoff mode from propagating to the pair of common nodes.

The output circuit preferably includes: a second constant current generation section configured to generate a pair of constant currents in a pair of current paths going from the pair of common nodes to the second reference node; a pair of output transistors formed in a pair of current paths going from a pair of output nodes to the pair of common nodes, and having a pair of gates to which a second bias voltage is supplied, the pair of output nodes being configured to output the pair of voltage signals; and a pair of load resistors formed in a pair of current paths going from the pair of output nodes to a third reference node. This configuration reduces the input impedance as compared to the conventional receiving circuit, thereby enabling the frequency characteristics to be improved.

Preferably, a voltage supplied to the third reference node is lower than a voltage supplied to the first reference node, and is higher than a voltage supplied to the second reference node. The power supply voltages set in this way allow a device connected following after the output circuit to have a lower breakdown voltage and thus have improved frequency characteristics.

According to another aspect of the invention, a receiving circuit for selectively receiving one of a plurality of input signals includes: a plurality of input buffer circuits, each supplied with one of the input signals and each being switchable between an output mode and a cutoff mode, each of the input buffer circuits supplying, in the output mode, to a common node a current signal corresponding to the input signal supplied to that input buffer circuit, and stopping the supply of the current signal in the cutoff mode; and an output circuit configured to convert the current signal supplied to the common node into a voltage signal. Each of the input buffer circuits includes a first constant current generation section configured to generate, in the output mode, a constant current in a current path going from an intermediate node to a first reference node, and stopping the generation of the constant current in the cutoff mode, the intermediate node being connected with the common node; and a voltage-to-current conversion section configured to generate, in the output mode, an input current corresponding to the input signal supplied to that input buffer circuit in a current path going from the intermediate node to a second reference node to thereby generate the current signal in a current path going from the intermediate node to the common node, and stopping the generation of the input current in the cutoff mode. In the receiving circuit, since the intermediate nodes in the input buffer circuits are all connected with the common node in the output circuit, variation in frequency characteristics among the input buffer circuits is reduced.

Effects of the Invention

As described above, variation in frequency characteristics among the input buffer circuits is reduced.

EXPLANATION OF THE REFERENCE CHARACTERS

Figure 1:
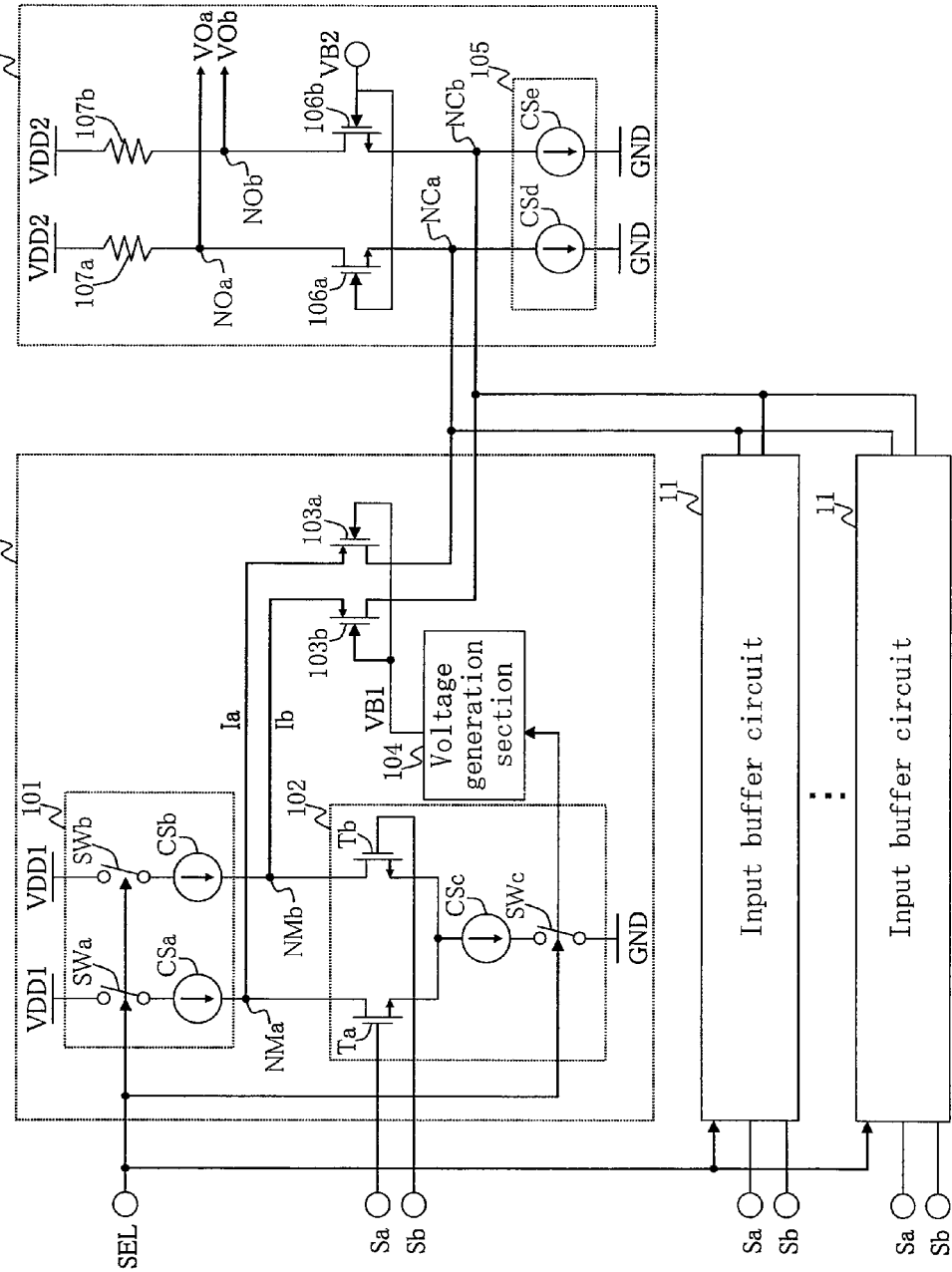
FIG. 1 shows an example of the configuration of a receiving circuit according to a first embodiment.

11 Input buffer circuit
12 Output circuit
101 Constant current generation section
102 Voltage-to-current conversion section
103a, 103b Input transistor 104 Voltage generation section
105 Constant current generation section
106a, 106b Output transistor
107a, 107b Load resistor
23 Reset circuit
301 Output voltage fixing section
302 Input voltage fixing section
RRR Resistive element
CCC Capacitive element

BEST MODE FOR CARRYING OUT THE INVENTION

Hereinafter, embodiments of the present invention will be described in detail with reference to the accompanying drawings. In the drawings, the same or equivalent components are denoted by the same reference numerals, and description thereof will not be repeated.

First Embodiment

FIG. 1 shows an example of the configuration of a receiving circuit according to a first embodiment of the present invention. This receiving circuit selectively receives one of multiple differential signals (pairs of input signals Sa and Sb), and includes input buffer circuits 11, 11, . . . , which are supplied with the differential signals, and an output circuit 12.

Each of the input buffer circuits 11, 11, . . . is capable of switching between an output mode and a cutoff mode according to a selection signal SEL; when the selection signal SEL is active (when the selection signal SEL is supplied), each input buffer circuit 11 is set to the output mode, and when the selection signal SEL is inactive (when the selection signal SEL is not supplied), each input buffer circuit 11 is set to the cutoff mode. In the output mode, each of the input buffer circuits 11, 11, . . . supplies common nodes NCa and NCb with current signals Ia and Ib corresponding to the input signals Sa and Sb supplied to that input buffer circuit 11, and in the cutoff mode, stops the supply of the current signals Ia and Ib. The output circuit 12 converts the current signals Ia and Ib supplied to the common nodes NCa and NCb into voltage signals VOa and VOb. The input buffer circuit 11 that is supplied with the differential signal to be received is set to the output mode, while the other input buffer circuits 11, 11, . . . are set to the cutoff mode, thereby enabling the output of a pair of voltage signals corresponding to the differential signal to be received.

Intermediate nodes NMa and NMb in the input buffer circuits 11, 11, . . . are all connected with the common nodes NCa and NCb, respectively, in the output circuit 12 through respective input transistors 103a and 103b. This equalizes the loads (such as the parasitic line capacitance and the parasitic line resistance) applied to the output terminals of the input buffer circuits 11, 11, . . . regardless of where the input buffer circuits 11, 11, . . . are arranged, thereby reducing variation in frequency characteristics among the input buffer circuits 11, 11, . . . and hence achieving stable reception.

[Input Buffer Circuits]

The input buffer circuits 11, 11, . . . each include a constant current generation section 101, a voltage-to-current conversion section 102, input transistors 103a and 103b, and a voltage generation section 104.

The constant current generation section 101 includes constant current sources CSa and CSb and switching elements SWa and SWb. The switching elements SWa and SWb perform switching to connect or disconnect the constant current sources CSa and CSb and power nodes (nodes to which a power supply voltage VDD1 is supplied) in response to the selection signal SEL. When the selection signal SEL is active, the switching elements SWa and SWb turn on, so that a pair of constant currents are generated in the pair of current paths going from the power nodes to the intermediate nodes NMa and NMb through the constant current sources CSa and CSb. On the other hand, when the selection signal SEL is inactive, the switching elements SWa and SWb turn off, thereby isolating the constant current sources CSa and CSb from the power nodes, and hence stopping the supply of the constant currents.

The voltage-to-current conversion section 102 includes differential transistors Ta and Tb, a constant current source CSc, and a switching element SWc. Input signals Sa and Sb are supplied to the gates of the differential transistors Ta and Tb. The switching element SWc performs switching to connect or disconnect the constant current source CSc and a ground node (a node to which a ground voltage GND is supplied) in response to the selection signal SEL.

When the selection signal SEL is active, the switching element SWc turns on. This causes the differential transistors Ta and Tb to convert the input signals Sa and Sb into a pair of input currents. The pair of input currents obtained by the differential transistors Ta and Tb are generated in the pair of current paths going from the intermediate nodes NMa and NMb to the ground node through the differential transistors Ta and Tb and the constant current source CSc. Since the constant current generation section 101 supplies the intermediate nodes NMa and NMb with the constant currents, a pair of currents corresponding to differences between the pair of constant currents and the pair of input currents are generated as the current signals Ia and Ib in the pair of current paths going from the intermediate nodes NMa and NMb to the common nodes NCa and NCb. On the other hand, when the selection signal SEL is inactive, the switching element SWc turns off, isolating the constant current source CSc from the ground node. Consequently, the pair of input currents corresponding to the input signals Sa and Sb are no longer generated.

The input transistors 103a and 103b are formed in the pair of current paths going from the common nodes NCa and NCb to the intermediate nodes NMa and NMb. A bias voltage VB1 is supplied to the gates of the input transistors 103a and 103b. Supplying the bias voltage VB1 to the gates of the input transistors 103a and 103b suppresses voltage variation at the intermediate nodes NMa and NMb, thereby allowing the constant current sources CSa and CSb to supply the constant currents accurately.

Figure 2:
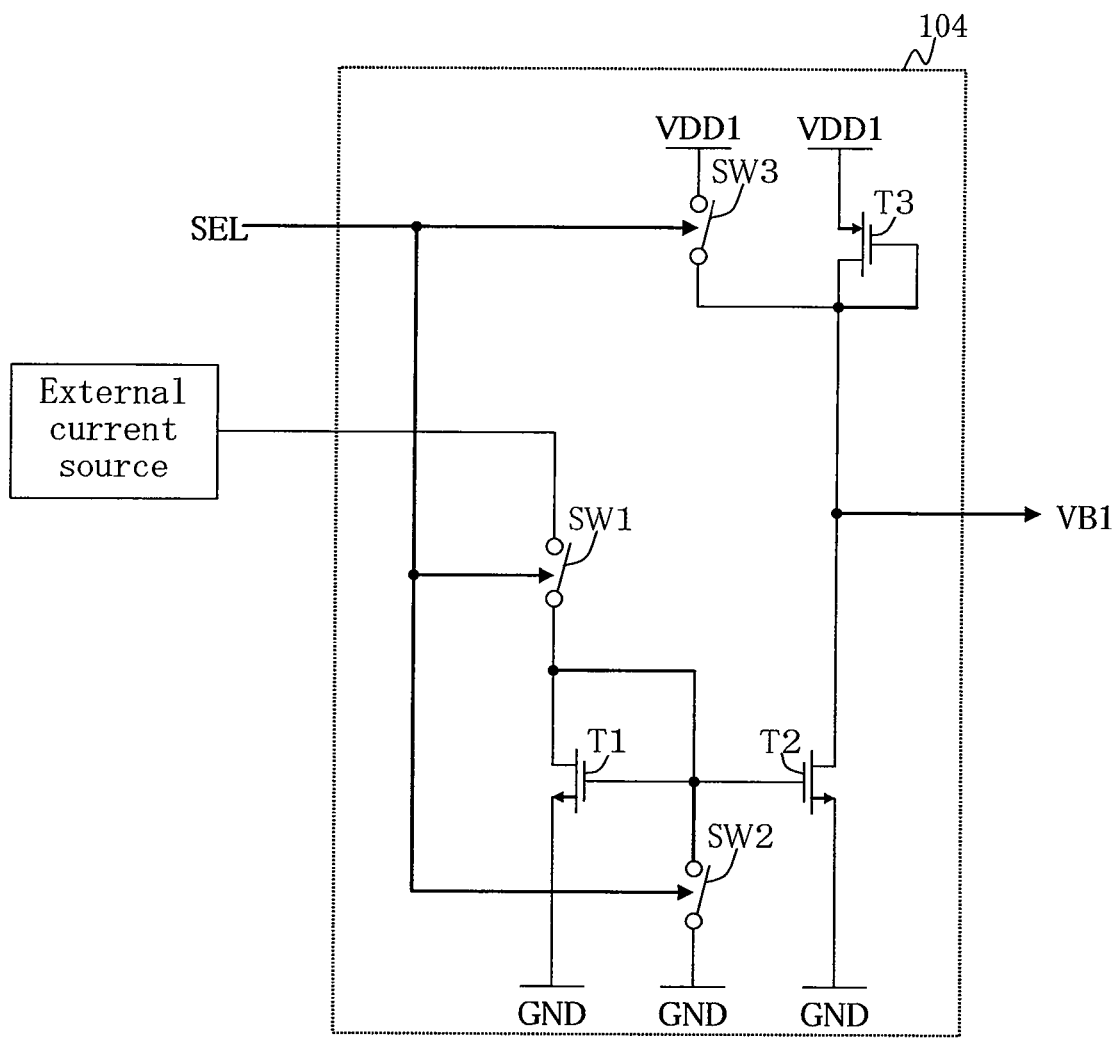
FIG. 2 shows an example of the configuration of a voltage generation section shown in FIG. 1.

The voltage generation section 104 generates the bias voltage VB1 when the selection signal SEL is active. This causes the input transistors 103a and 103b to turn on, so that the current signals Ia and Ib are supplied to the common nodes NCa and NCb through the input transistors 103a and 103b. When the selection signal SEL is inactive, the voltage generation section 104 stops the supply of the bias voltage VB1. This causes the input transistors 103a and 103b to turn off, thereby preventing noise from the input buffer circuit 11 being in the cutoff mode from propagating to the common nodes NCa and NCb. For example, as shown in FIG. 2, the voltage generation section 104 includes transistors T1 and T2, a pMOS transistor T3, and switching elements SW1, SW2, and SW3. The transistors T1 and T2 form a current mirror circuit. The switching elements SW1, SW2, and SW3 turn on or off in response to the selection signal SEL.

[Output Circuit]

The output circuit 12 includes a constant current generation section 105, output transistors 106a and 106b, and load resistors 107a and 107b.

The constant current generation section 105 generates a pair of constant currents in the pair of current paths going from the common nodes NCa and NCb to ground nodes. This causes the current signals Ia and Ib to travel through the pair of current paths going from power nodes (nodes to which a power supply voltage VDD2 is supplied) to the common nodes NCa and NCb through output nodes NOa and NOb. For example, the constant current generation section 105 includes constant current sources CSd and CSe.

The output transistors 106a and 106b are formed in the pair of current paths going from the output nodes NOa and NOb to the common nodes NCa and NCb. A bias voltage VB2 is supplied to the gates of the output transistors 106a and 106b. Since the output transistors 106a and 106b are connected with the common nodes NCa and NCb in this way, the input impedance of the output circuit 12 is almost equal to the reciprocal of the transconductance of the output transistors 106a and 106b. Thus, the input impedance is reduced as compared to the conventional receiving circuit, thereby improving the frequency characteristics of the receiving circuit.

The load resistors 107a and 107b are formed in the pair of current paths going from the power nodes to the output nodes NOa and NOb. These load resistors 107a and 107b convert the current signals Ia and Ib into voltage signals VOa and VOb.

[Magnitudes of the Power Supply Voltages]

The power supply voltage VDD2 may be lower than the power supply voltage VDD1. Such a configuration allows the voltage signals VOa and VOb to have a lower common mode potential than a common mode potential of the input signals Sa and Sb, thereby reducing breakdown voltage restrictions in a device connected following after the output circuit 12. To be specific, transistors included in the following device are allowed to have a lower breakdown voltage as compared to a case in which the voltage signals VOa and VOb have the same common mode potential as a common mode potential of the input signals Sa and Sb. For example, the following device may include nMOS transistors having a lower breakdown voltage than pMOS transistors. Furthermore, generally, as the breakdown voltage of a transistor is lowered, the gain-bandwidth product (ft) of that transistor can be increased. It is therefore possible to improve the frequency characteristics of the following device by lowering the breakdown voltage thereof.

[Magnitudes of the Constant Currents]

The constant currents supplied by the constant current generation section 105 may be larger than those supplied by the constant current generation section 101. If, in an input buffer circuit 11, the voltage-to-current conversion section 102 is put into the cutoff mode when the constant current generation section 101 is supplying a pair of constant currents, all of the pair of constant currents from the constant current generation section 101 will flow into the common nodes NCa and NCbs in the output circuit 12. For example, when the common mode potential of the input signals Sa and Sb lowers to cause the differential transistors Ta and Tb to both turn off, such a phenomenon occurs. In this situation, if the constant currents from the constant current generation section 105 are smaller than those from the constant current generation section 101, the voltages at the common nodes NCa and NCb may increase to cause a breakdown in the output transistors 106a and 106b. It is thus possible to prevent voltage increase at the common nodes NCa and NCb by setting the constant currents from the constant current generation section 105 larger than those from the constant current generation section 101.

(Modified Example of the Input Buffer Circuits)

Figure 3:
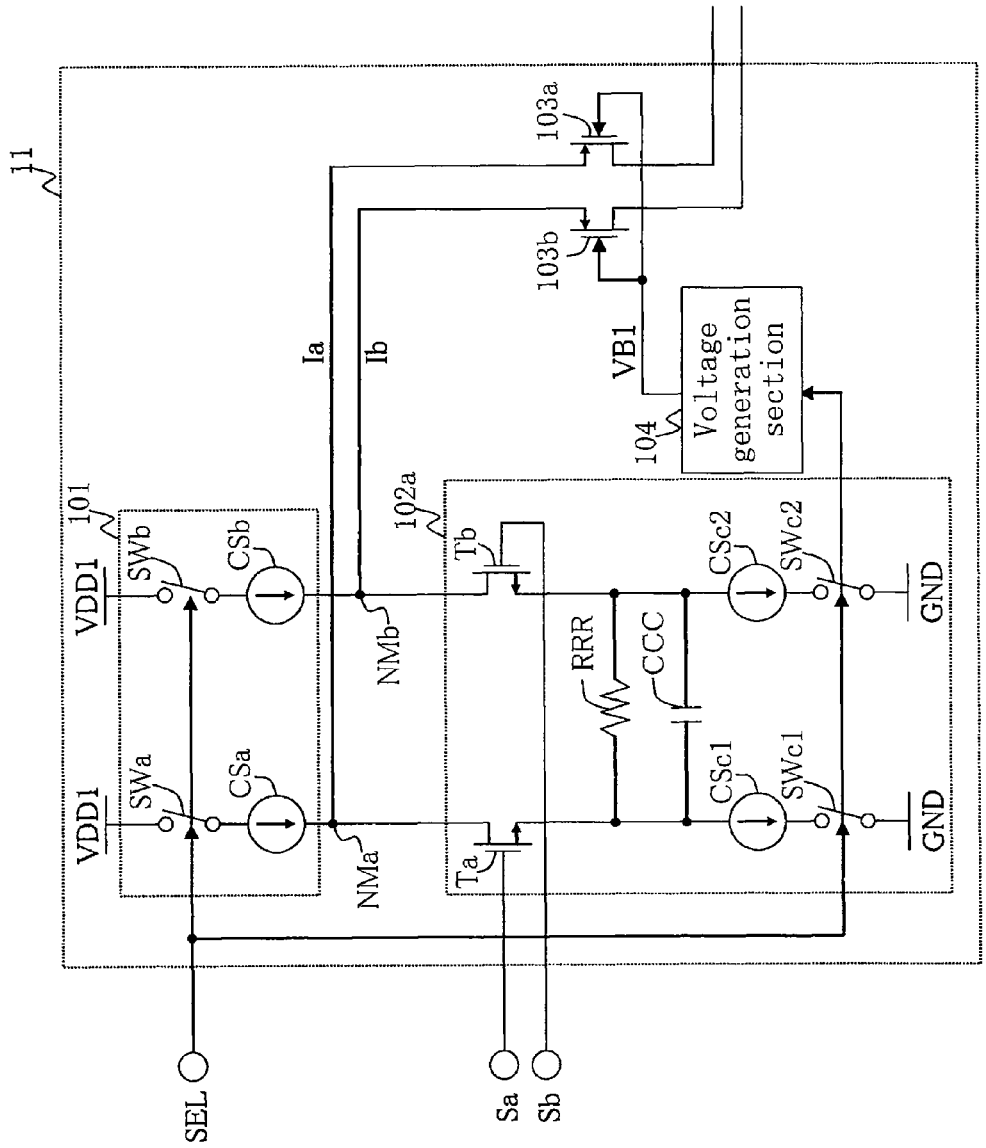
FIG. 3 is an explanatory view of a modified example of input buffer circuits shown in FIG. 1.

As shown in FIG. 3, each input buffer circuit 11 may include a voltage-to-current conversion section 102a having highpass filter characteristics in place of the voltage-to-current conversion section 102 shown in FIG. 1. The voltage-to-current conversion section 102a includes a resistive element RRR and a capacitive element CCC in addition to the components of the voltage-to-current conversion section 102 shown in FIG. 1. The voltage-to-current conversion section 102a also includes constant current sources CSc1 and CSc2 and switching elements SWc1 and SWc2 instead of the constant current source CSc and the switching element SWc. This configuration suppresses attenuation of high-frequency signals, thereby broadening the receivable band of the receiving circuit. The resistive element RRR may have a variable resistance value, and the capacitive element CCC may have a variable capacitance value. The resistive element RRR and the capacitive element CCC thus configured allow adjustment of the DC gain value and the cutoff frequency of the input buffer circuit 11. Moreover, it is possible to set the received waveform to an ideal condition by setting the resistance value and the capacitance value according to the frequency and amplitude of the input signals Sa and Sb.

[Modified Example of the Output Circuit]

Figure 4:
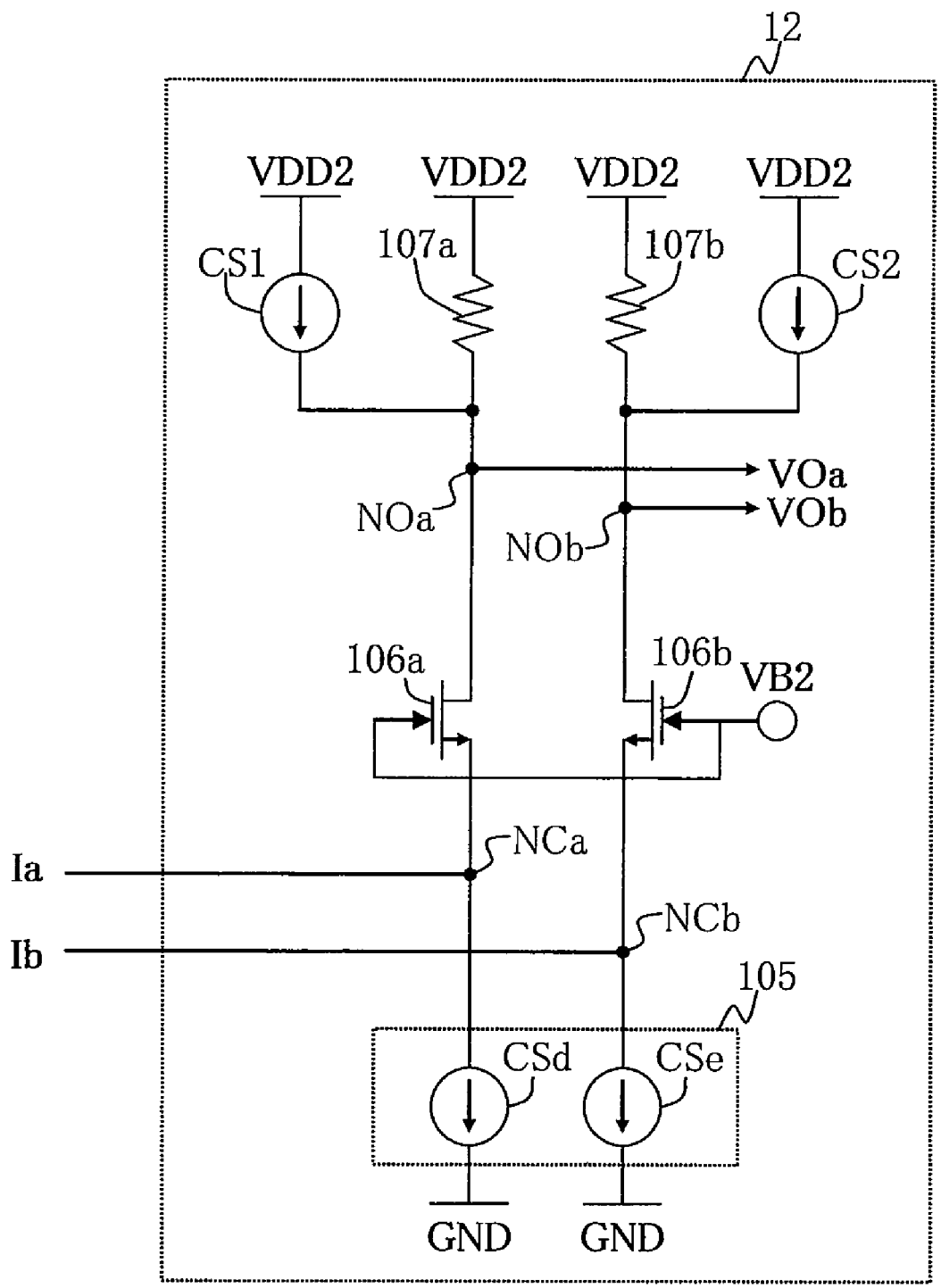
FIG. 4 is an explanatory view of a modified example of an output circuit shown in FIG. 1.

As shown in FIG. 4, the output circuit 12 may include current sources CS1 and CS2 in addition to the components shown in FIG. 1. The current source CS1 is connected between a power node and the output node NOa in parallel with the load resistor 107a. The current source CS2 is connected between a power node and the output node NOb in parallel with the load resistor 107b. This configuration increases the amount of current in the pair of current paths going from the output nodes NOa and NOb to the common nodes NCa and NCb, thereby further reducing the input impedance of the output circuit 12.

Second Embodiment

Figure 5:
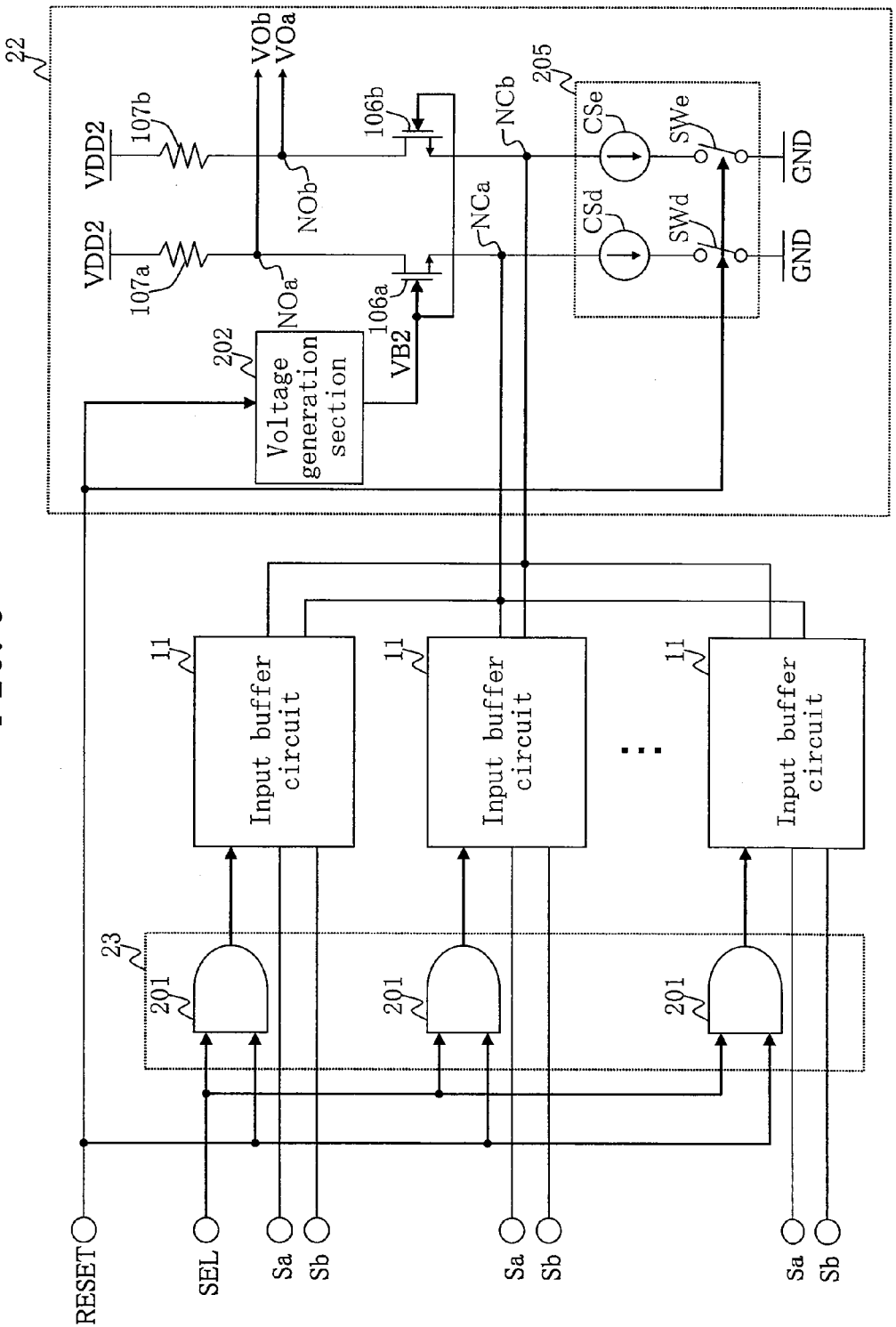
FIG. 5 shows an example of the configuration of a receiving circuit according to a second embodiment.

FIG. 5 shows an example of the configuration of a receiving circuit according to a second embodiment of the present invention. This receiving circuit includes an output circuit 22 in place of the output circuit 12 shown in FIG. 1, and includes a reset circuit 23.

[Output Circuit]

The output circuit 22 includes a constant current generation section 205 in place of the constant current generation section 105 shown in FIG. 1, and further includes a voltage generation section 202. The voltage generation section 202 performs switching to supply and or not to supply a bias voltage VB2 in response to a reset signal RESET for resetting the output circuit 22. The constant current generation section 205 includes constant current sources CSd and CSe and switching elements SWd and SWe. The switching elements SWd and SWe perform switching to connect or disconnect the constant current sources CSd and CSe and ground nodes in response to the reset signal RESET.

When the reset signal RESET is inactive, the voltage generation section 202 supplies the bias voltage VB2 to the gates of output transistors 106a and 106b. Also, the switching elements SWd and SWe turn on, causing generation of a pair of constant currents in the pair of current paths going from common nodes NCa and NCb to the ground nodes. This allows current signals Ia and Ib from an input buffer circuit 11 to be converted into voltage signals VOa and VOb. On the other hand, when the reset signal RESET is active, the voltage generation section 202 stops the supply of the bias voltage VB2. Also, the switching elements SWd and SWe turn off, thereby isolating the constant current sources CSd and CSe from the ground nodes to stop the generation of the constant currents. This resets the output circuit 22.

[Reset Circuit]

The reset circuit 23 performs switching to pass or cut off a selection signal SEL in response to the reset signal RESET, thereby controlling the operation modes of the input buffer circuits 11, 11, . . . . The reset circuit 23 includes AND circuits 201, 201, . . . corresponding to the input buffer circuits 11, 11, . . . . The AND circuits 201, 201, . . . each perform switching to pass or cut off the selection signal SEL in response to the reset signal RESET.

When the reset signal RESET is inactive (when the reset signal RESET is at the high level in this embodiment), the reset circuit 23 passes the selection signal SEL through the input buffer circuits 11, 11, . . . . Consequently, the selection signal SEL controls the respective operation modes of the input buffer circuits 11, 11, . . . . On the other hand, when the reset signal RESET is active (when the reset signal RESET is at the low level in this embodiment), the reset circuit 23 cuts off the selection signal SEL. This causes the selection signal SEL to become inactive in each of the input buffer circuits 11, 11, . . . , and thus the input buffer circuits 11, 11, . . . are each forced into the cutoff mode.

As described above, all of the input buffer circuits 11, 11, . . . are forced into the cutoff mode when the output circuit 22 is in the reset state irrespective of the state of the selection signal SEL. This prevents the input buffer circuits 11, 11, . . . from supplying unnecessary current signals Ia and Ib, thereby suppressing voltage variation at the input terminals (the common nodes NCa and NCb) of the output circuit.

Third Embodiment

Next, with reference to FIGS. 5 to 7, a receiving circuit according to a third embodiment of the present invention will be discussed. This receiving circuit includes input buffer circuits 31, 31, . . . (see FIG. 6) and an output circuit 32 (see FIG. 7) in place of the input buffer circuits 11, 11, . . . and the output circuit 22 shown in FIG. 5.

[Input Buffer Circuits]

Figure 6:
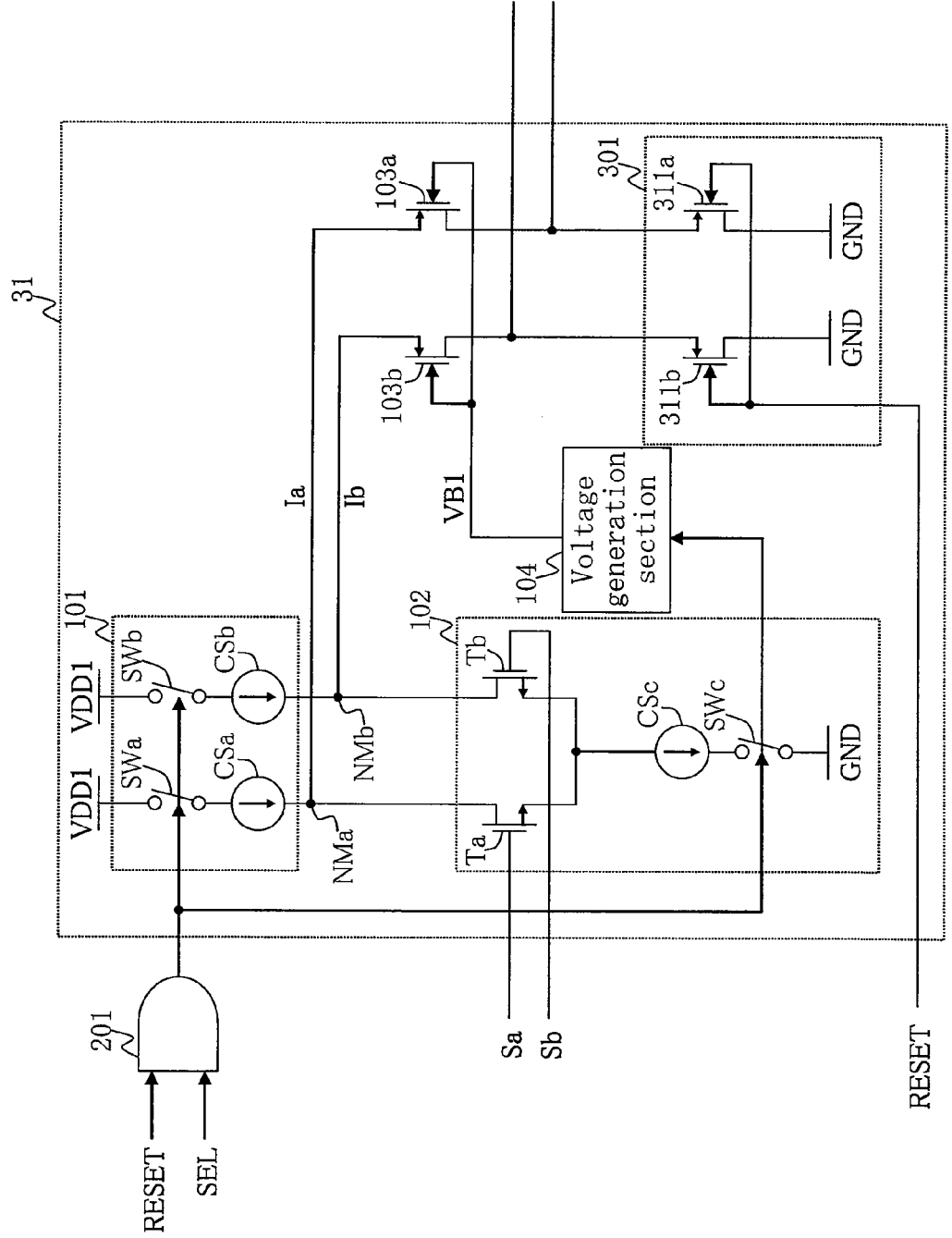
FIG. 6 shows an example of the configuration of an input buffer circuit in a third embodiment.

The input buffer circuit 31 shown in FIG. 6 includes an input voltage fixing section 301 in addition to the components shown in FIG. 1. The input voltage fixing section 301 includes pull-down transistors 311a and 311b, which perform switching to connect or disconnect the drains of input transistors 103a and 103b and ground nodes in response to a reset signal RESET.

When the reset signal RESET is active (when the reset signal RESET is at the low level in this embodiment), the pull-down transistors 311a and 311b turn on, thereby fixing the drain voltages of the input transistors 103a and 103b. This suppresses voltage variation at the input terminals (the common nodes NCa and NCb) of the output circuit 32 that are connected with the drains of the input transistors 103a and 103b. On the other hand, when the reset signal RESET is inactive (when the reset signal RESET is at the high level in this embodiment), the pull-down transistors 311a and 311b turn off, thereby canceling the fixing of the drain voltages of the input transistors 103a and 103b.

[Output Circuit]

Figure 7:
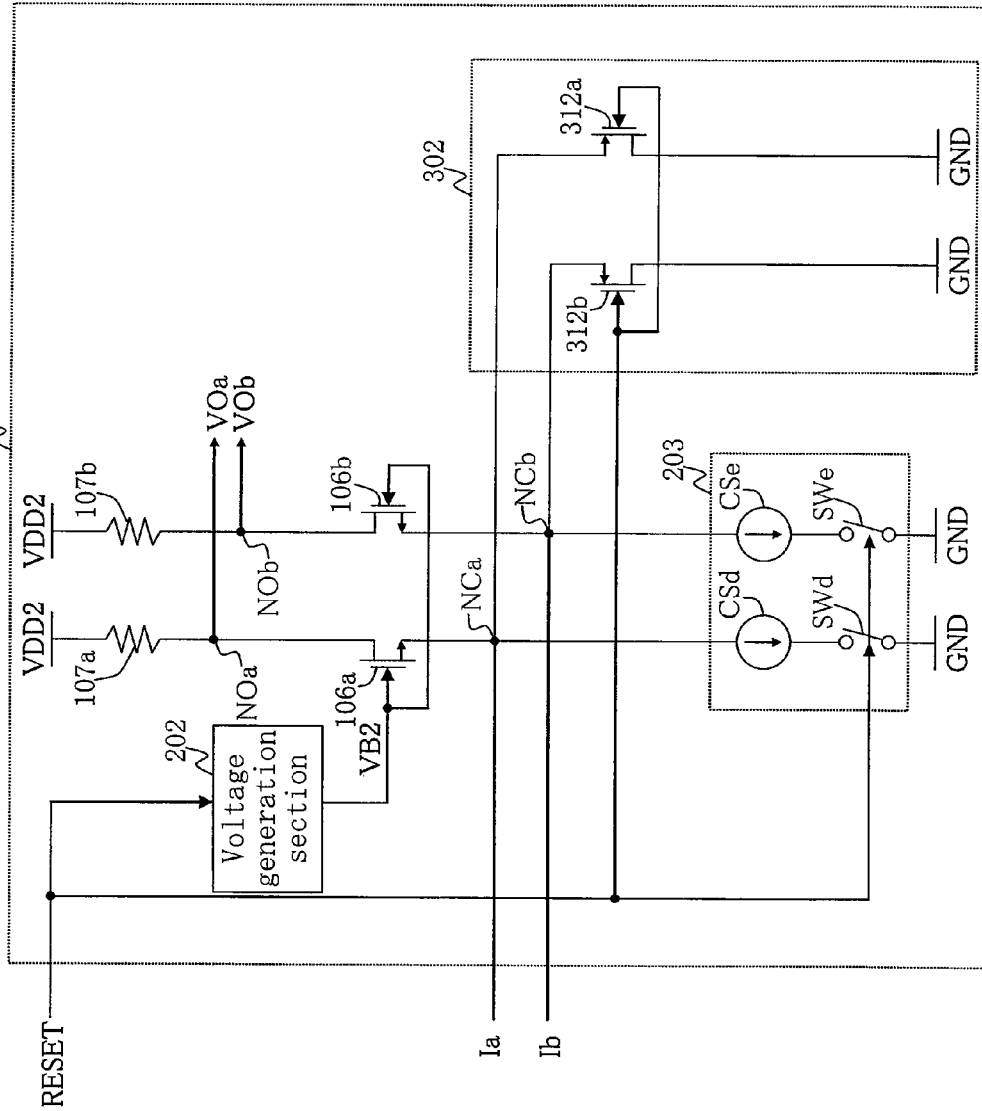
FIG. 7 shows an example of the configuration of an output circuit in the third embodiment.

The output circuit 32 shown in FIG. 7 includes an output voltage fixing section 302 in addition to the components shown in FIG. 5. The output voltage fixing section 302 includes pull-down transistors 312a and 312b, which perform switching to connect or disconnect the common nodes NCa and NCb and ground nodes in response to the reset signal RESET.

When the reset signal RESET is active, the pull-down transistors 312a and 312b turn on, thereby fixing the voltages at the common nodes NCa and NCb. This suppresses voltage variation at the common nodes NCa and NCb. On the other hand, when the reset signal RESET is inactive, the pull-down transistors 312a and 312b turn off, thereby canceling the voltage fixing.

As described above, since the voltages at the common nodes NCa and NCb are fixed when the output circuit 32 is in the reset state, voltage variation at the common nodes NCa and NCb is suppressed further. The input voltage fixing section 301 and the output voltage fixing section 302 are applicable to the receiving circuit shown in FIG. 1. To be specific, provision of at least either the input voltage fixing section 301 or the output voltage fixing section 302 enables the output circuit 12 to be reset.

(Configuration of the Output Circuit)

Figure 8:
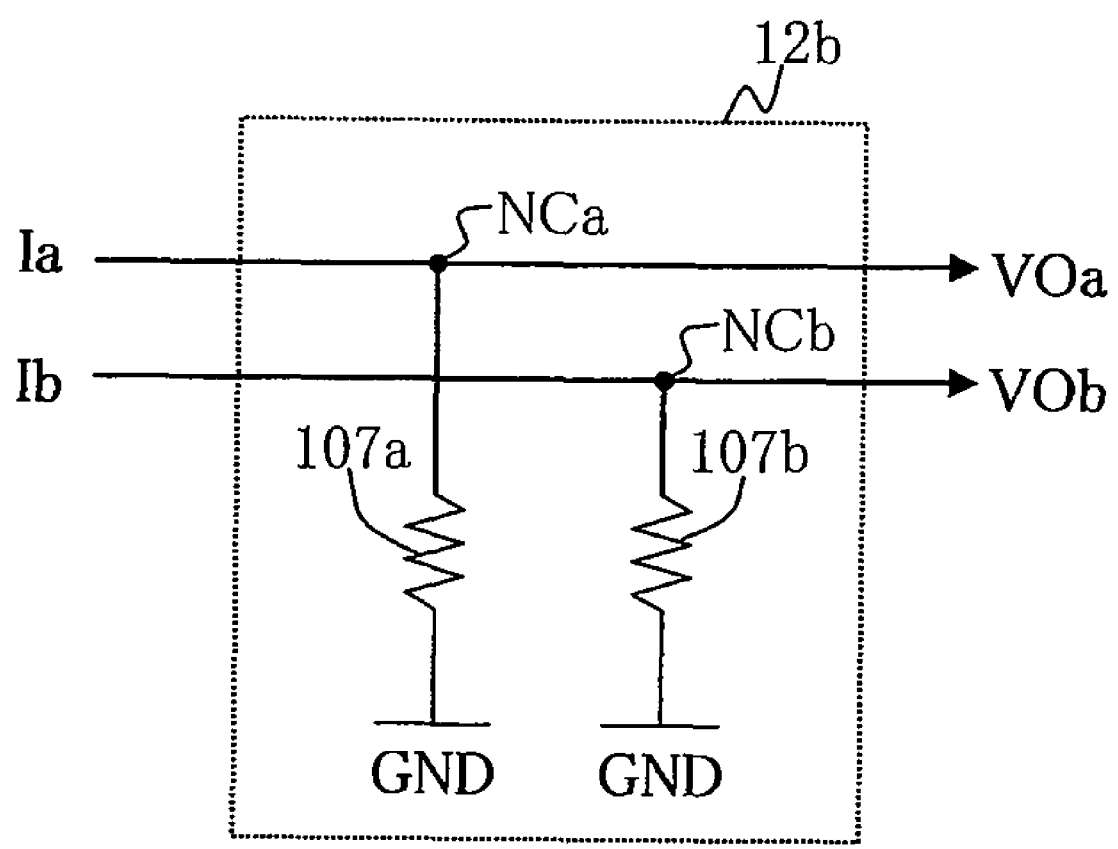
FIG. 8 is an explanatory view of a modified example of the output circuit.

In the foregoing embodiments, the output circuit may be configured as shown in FIG. 8. The output circuit 12b shown in FIG. 8 includes load resistors 107a and 107b formed in the pair of current paths going from common nodes NCa and NCb to ground nodes. This configuration also allows the intermediate nodes NMa and NMb in the input buffer circuits to be all connected with the common nodes NCa and NCb, respectively, in the output circuit 12b, thereby reducing variation in frequency characteristics among the input buffer circuits.

(Configuration of the Input Buffer Circuits)

The input buffer circuits may be configured in various ways, and are thus not limited to the configurations shown in FIGS. 1, 3, and 6. For example, as shown in FIG. 9, each input buffer circuit 11 may include a voltage-to-current conversion section 102b, in which the drains of differential transistors Ta and Tb are directly connected with ground nodes, instead of the voltage-to-current conversion section 102, in which the drains of the differential transistors Ta and Tb are both connected with the constant current source CSc.

Figure 9:
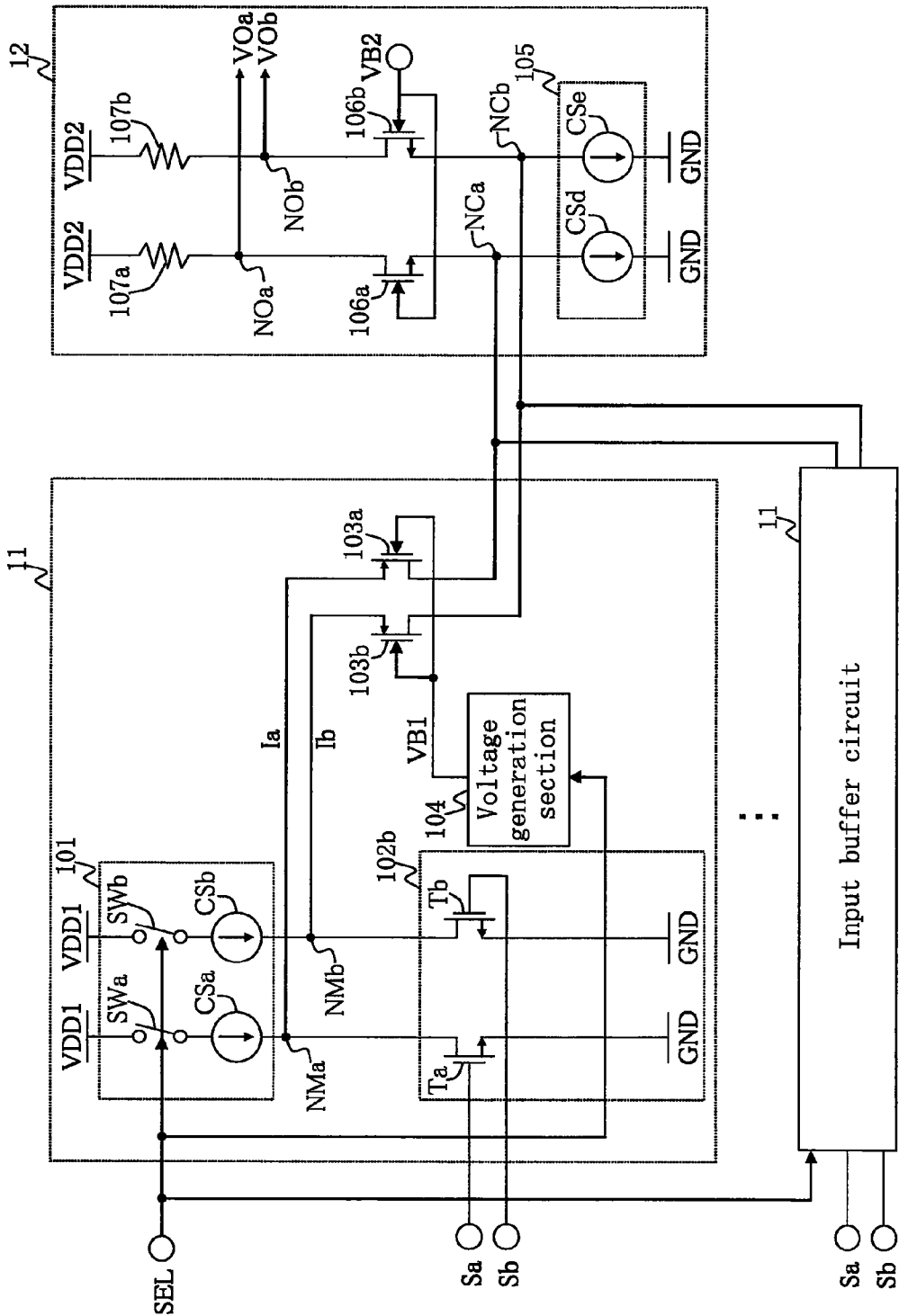
FIG. 9 is an explanatory view of a modified example of the input buffer circuits.

Also, as can be seen from FIG. 9, the receiving circuits in the foregoing embodiments may receive not only a differential signal but also a single input signal. For example, the receiving circuits may be configured in such a manner that each of the input buffer circuits 11, 11, . . . is supplied with a single input signal Sa instead of a differential signal, and supplies a current signal Ia corresponding to the input signal Sa, and that the output circuit 12 converts the current signal Ia supplied to the common node NCa into a voltage signal VOa.

(Modified Example of the Receiving Circuits)

Figure 10:
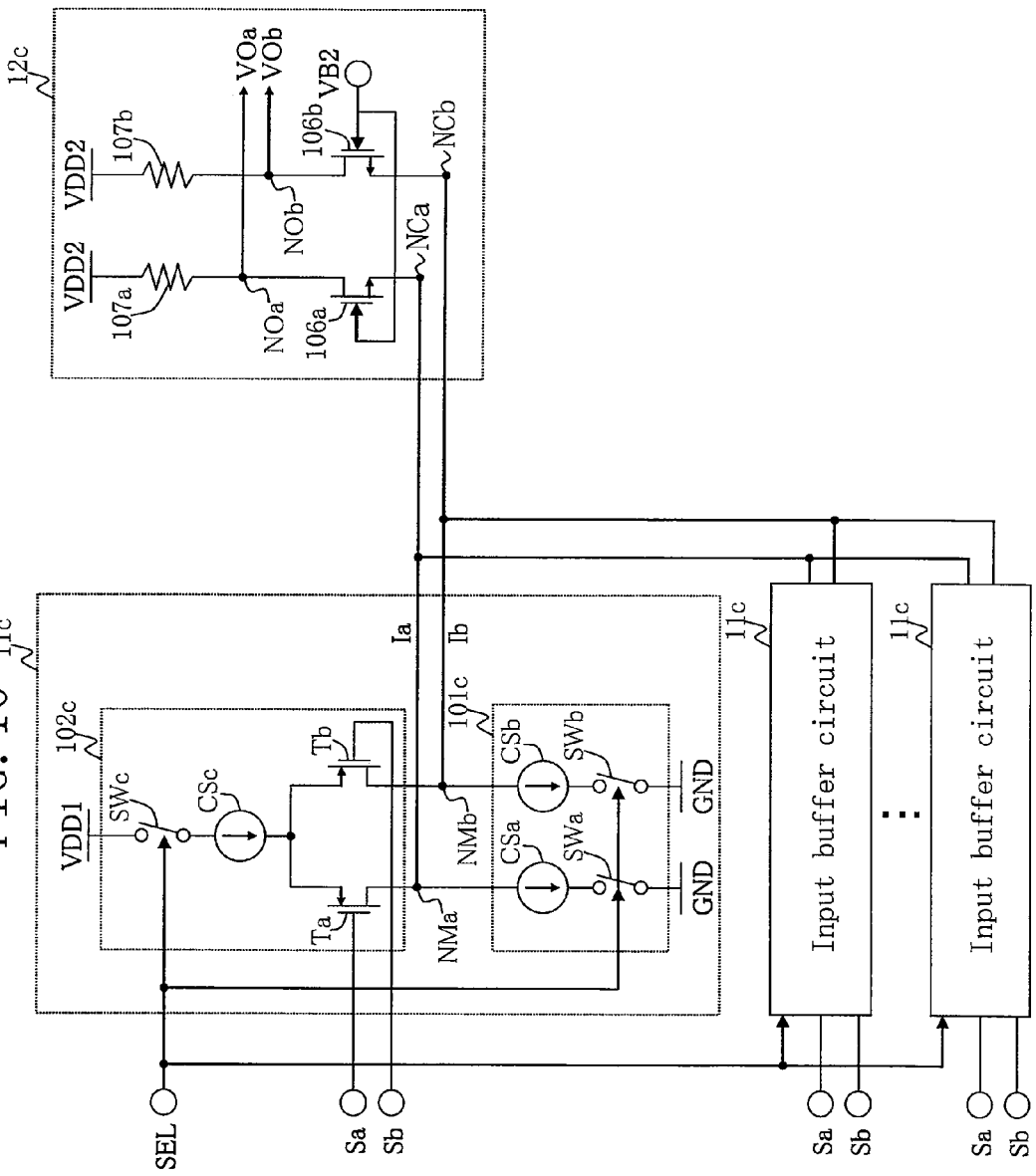
FIG. 10 is an explanatory view of a modified example of the receiving circuits.

As shown in FIG. 10, the receiving circuits in the foregoing embodiments may be configured so as to receive the differential signals based on a ground voltage GND. The receiving circuit shown in FIG. 10 includes input buffer circuits 11c, 11c, . . . and an output circuit 12c. The input buffer circuits 11c, 11c, . . . each include a constant current generation section 101c and a voltage-to-current conversion section 102c. In the output mode, the constant current generation section 101c generates a pair of constant currents in the pair of current paths going from intermediate nodes NMa and NMb to ground nodes, and in the cutoff mode, stops the generation of the pair of constant currents. In the output mode, the voltage-to-current conversion section 102c generates a pair of input currents corresponding to input signals Sa and Sb in the pair of current paths going from the intermediate nodes NMa and NMb to a power node (a node to which a power supply voltage VDD1 is supplied), thereby generating a pair of current signals Ia and Ib. In the cutoff mode, the voltage-to-current conversion section 102c stops the generation of the pair of input currents. The output circuit 12c converts the current signals Ia and Ib supplied to the common nodes NCa and NCb into voltage signals VOa and VOb. This configuration also allows the intermediate nodes NMa and NMb in the input buffer circuits 11c, 11c, ... to be all connected with the common nodes NCa and NCb, respectively, thereby reducing variation in frequency among the input buffer circuits 11c, 11c, ....

(Receiving System)

Figure 11:
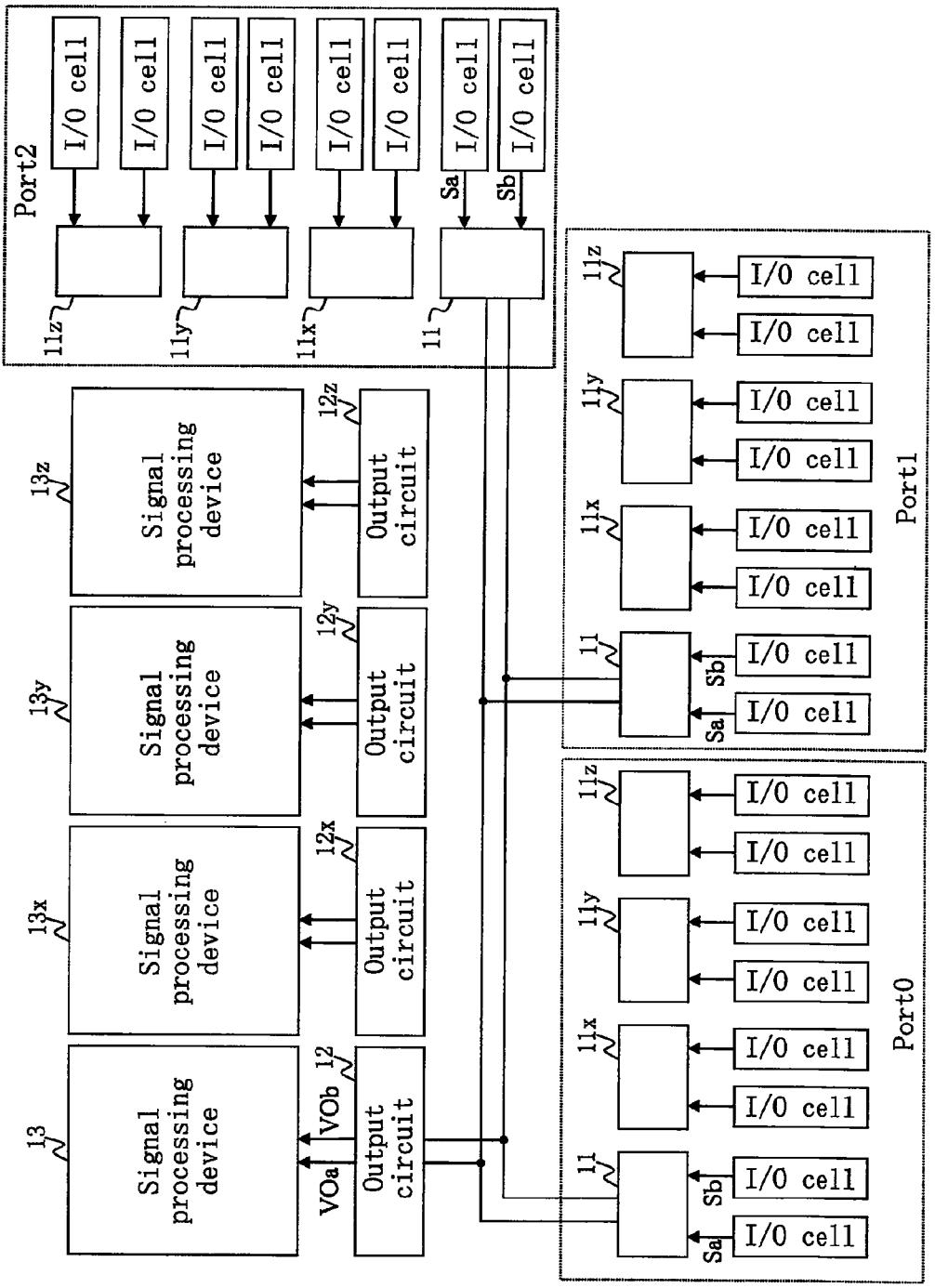
FIG. 11 shows an example of the configuration of a receiver LSI including the receiving circuit shown in FIG. 1.
Figure 12:
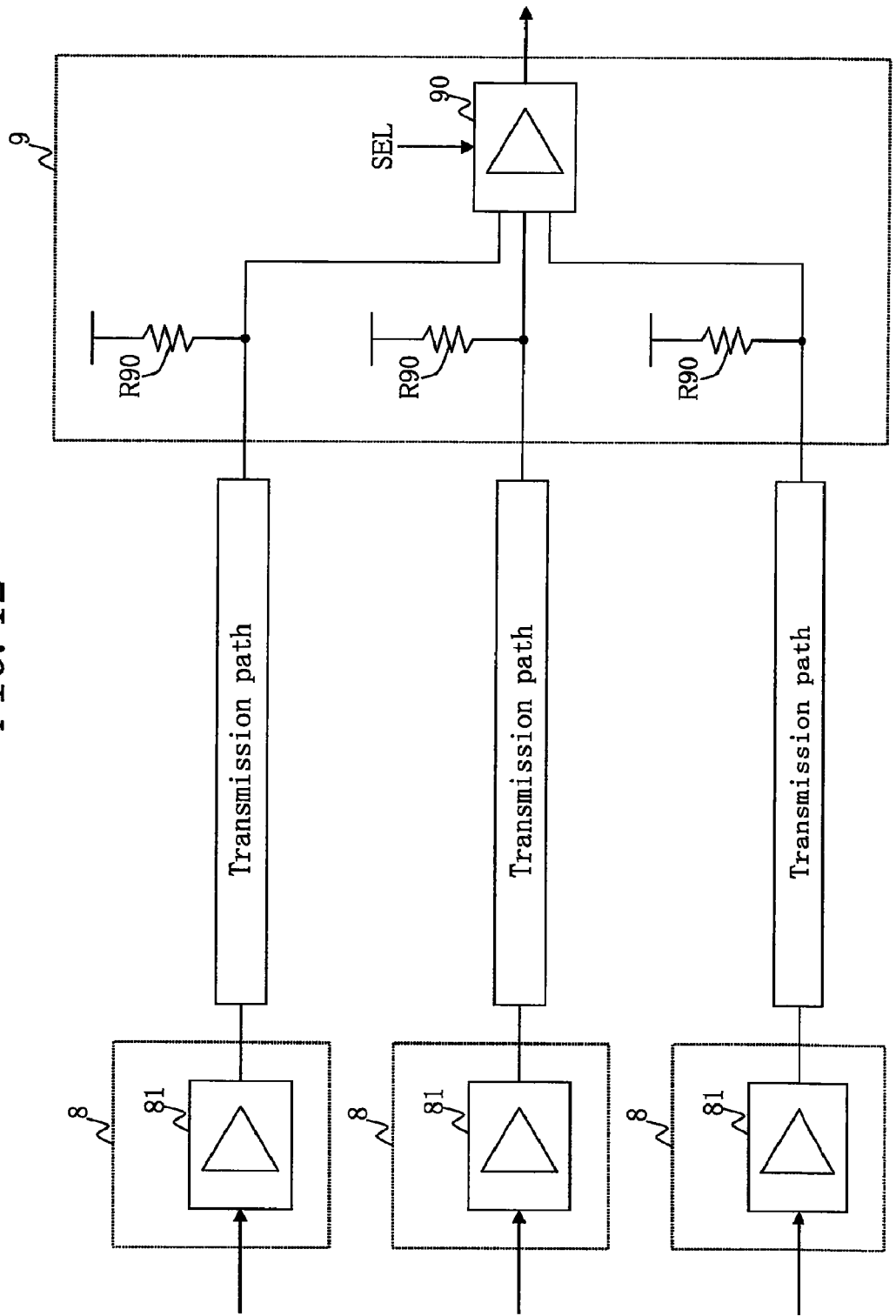
FIG. 12 is an explanatory view of many-to-one communications.
Figure 13:
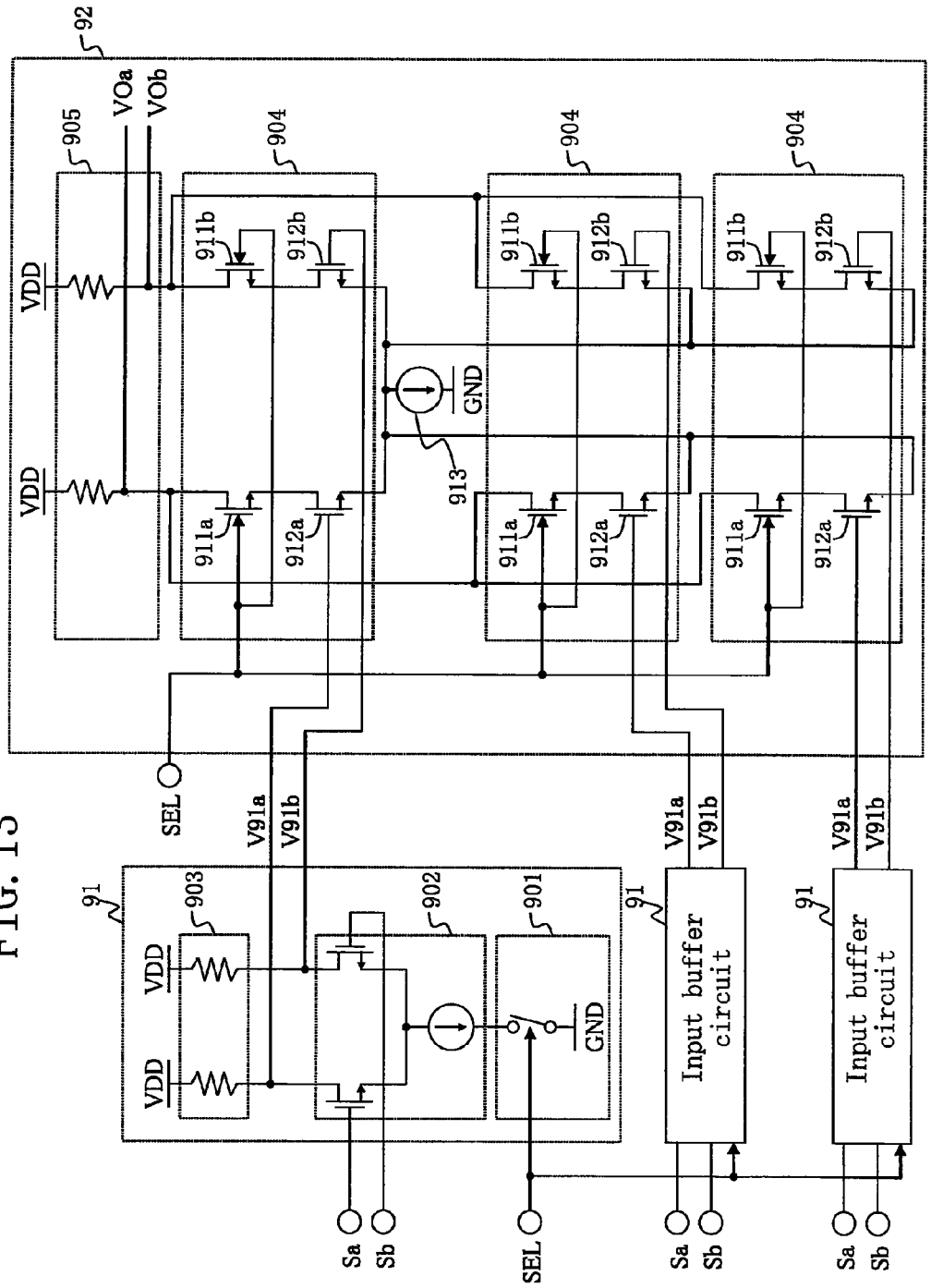
FIG. 13 shows the configuration of a conventional receiving circuit capable of many-to-one communications.
Figure 14:
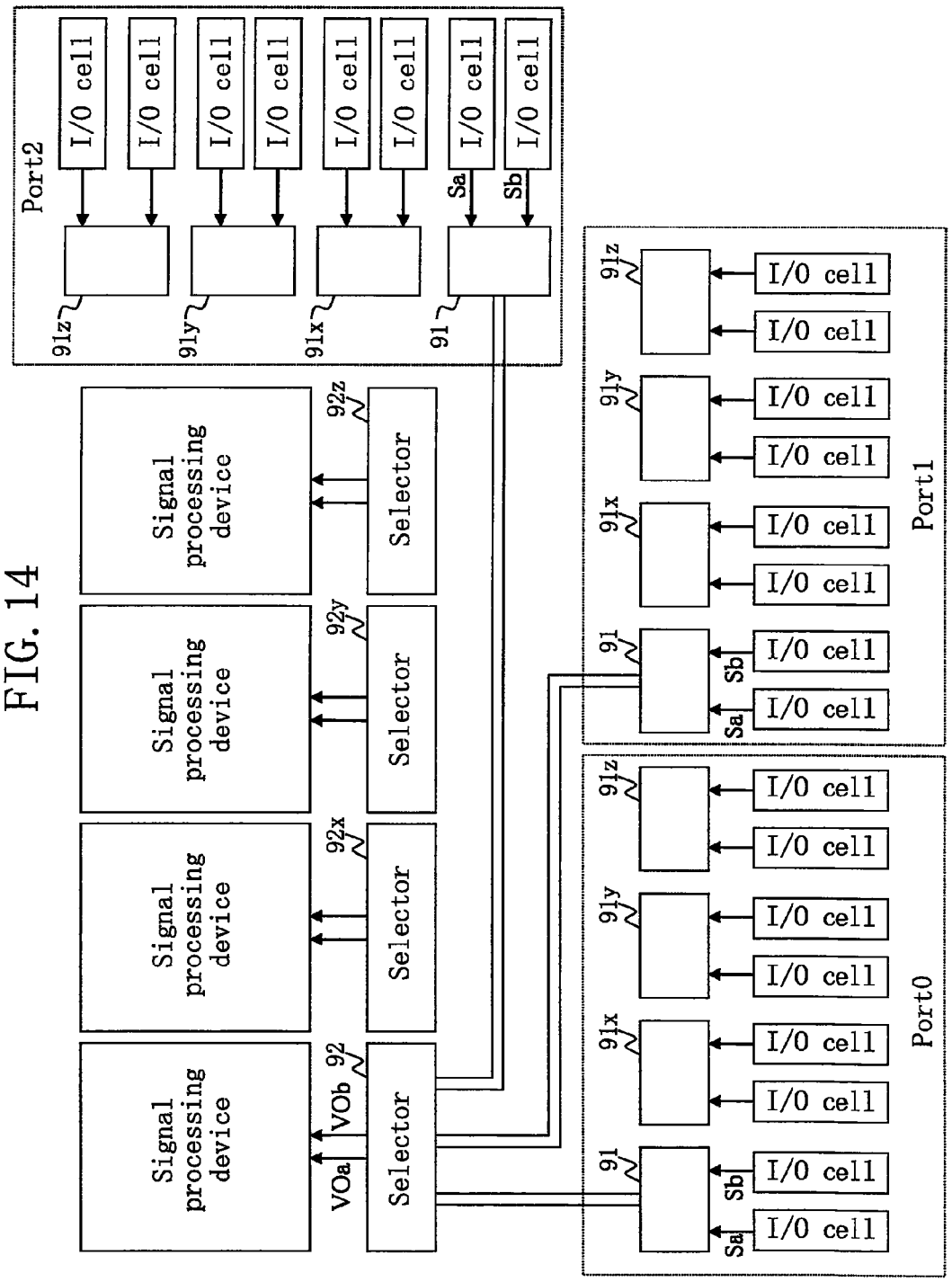
FIG. 14 shows the configuration of a receiver LSI including the receiving circuit shown in FIG. 13.

As shown in FIG. 11, the receiving circuits in the foregoing embodiments are applicable to a receiver LSI (a receiving system). The receiver LSI shown in FIG. 11 includes 24 I/O cells, 12 input buffer circuits 11, 11x, ..., 4 output circuits 12, 12x, ..., and 4 signal processing devices 13, 13x, .... Also, each set of three input buffer circuits, an output circuit, and a signal processing device forms a data channel. For example, the three input buffer circuits 11, 11, and 11 and the output circuit 12 belong to the same data channel as the signal processing device 13. Likewise, the input buffer circuits 11x and the output circuit 12x belong to the same data channel as the signal processing device 13x, the input buffer circuits 11y and the output circuit 12y belong to the same data channel as the signal processing device 13y, and the input buffer circuits 11z and the output circuit 12z belong to the same data channel as the signal processing device 13z.

In each of the input ports 0, 1, and 2, four input buffer circuits 11, 11x, 11y, and 11z are arranged according to the arrangement of eight I/O cells. The input buffer circuits 11, 11, and 11 formed in the input ports 0, 1, and 2 are connected with the output circuit 12 through a common pair of lines. The signal processing device 13 processes voltage signals VOa and VOb from the output circuit 12. The connection relationships in the other data channels are the same as those in the data channel to which the input buffer circuits 11, 11, and 11, the output circuit 12, and the signal processing device 13 belong, and the illustration thereof is thus omitted. In this receiver LSI, variation in frequency among the input buffer circuits is reduced, allowing the signal processing devices to perform signal processing correctly.

INDUSTRIAL APPLICABILITY

As described above, the receiving circuits according to the present invention, which reduce variation in frequency characteristics among the input buffer circuits therein and thus achieve stable reception, are applicable to, e.g., high-speed signal transmission systems that need to perform many-to-one communications.

The invention claimed is:

1. A receiving apparatus including a receiving circuit for selectively receiving one pair of a plurality of pairs of input signals, comprising:

a plurality of input buffer circuits, each supplied with one pair of the pairs of input signals and each being switchable between an output mode and a cutoff mode, each of the input buffer circuits supplying, in the output mode, to a pair of common nodes a pair of current signals corresponding to the pair of input signals supplied to that input buffer circuit, and stopping the supply of the pair of current signals in the cutoff mode; and an output circuit configured to convert the pair of current signals supplied to the pair of common nodes into a pair of voltage signals, wherein each of the input buffer circuits includes a first constant current generation section configured to generate, in the output mode, a pair of constant currents in a pair of current paths going from a pair of intermediate nodes to a first reference node, and stopping the generation of the pair of constant currents in the cutoff mode, the pair of intermediate nodes being connected with the pair of common nodes;

a voltage-to-current conversion section configured to generate, in the output mode, a pair of input currents corresponding to the pair of input signals supplied to that input buffer circuit in a pair of current paths going from the pair of intermediate nodes to a second reference node to thereby generate the pair of current signals in a pair of current paths going from the pair of intermediate nodes to the pair of common nodes, and stopping the generation of the pair of input currents in the cutoff mode; and a pair of input transistors formed in the pair of current paths going from the pair of intermediate nodes of that input buffer circuit to the pair of common nodes, the pair of input transistors having a pair of gates to which a first bias voltage is supplied, wherein the output circuit includes a second constant current generation section configured to generate a pair of constant currents in a pair of current paths going from the pair of common nodes to the second reference node;

a pair of output transistors formed in a pair of current paths going from a pair of output nodes to the pair of common nodes, and having a pair of gates to which a second bias voltage is supplied, the pair of output nodes being configured to output the pair of voltage signals; and a pair of load resistors formed in a pair of current paths going from the pair of output nodes to a third reference node.

2. The receiving apparatus of claim 1, wherein each of the input buffer circuits further includes an input voltage fixing section configured to fix drain voltages of the pair of input transistors in that input buffer circuit when a reset signal is active, and canceling the fixing of the drain voltages when the reset signal is inactive.

3. The receiving apparatus of claim 1, wherein each of the input buffer circuits further includes a first voltage generation section configured to supply, in the output mode, the first bias voltage to the pair of gates of the pair of input transistors, and stopping the supply of the first bias voltage in the cutoff mode.

4. The receiving apparatus of claim 1, wherein the output circuit further includes an output voltage fixing section configured to fix voltages at the pair of common nodes when a reset signal is active, and canceling the fixing of the voltages at the pair of common nodes when the reset signal is inactive.

5. The receiving apparatus of claim 1, wherein a voltage supplied to the third reference node is lower than a voltage supplied to the first reference node, and is higher than a voltage supplied to the second reference node.

6. The receiving apparatus of claim 1, wherein the constant currents generated by the second constant current generation section are larger than the constant currents generated by the first constant current generation section.

7. The receiving apparatus of claim 1, wherein the output circuit further includes a pair of current sources formed in the pair of current paths going from the pair of output nodes to the third reference node so as to be in parallel with the pair of load resistors.

8. The receiving apparatus of claim 1, further comprising a reset circuit configured to force each of the input buffer circuits into the cutoff mode in response to a reset signal, wherein the output circuit further includes a second voltage generation section configured to supply the second bias voltage to the pair of gates of the pair of output transistors when the reset signal is inactive, and stopping the supply of the second bias voltage when the reset signal is active; and the second constant current generation section generates the pair of constant currents in the pair of current paths going from the pair of common nodes to the second reference node when the reset signal is inactive, and stops the generation of the pair of constant currents when the reset signal is active.

9. The receiving apparatus of claim 1, wherein the voltage-to-current conversion section includes:

a pair of differential transistors formed in the pair of current paths going from the pair of intermediate nodes to the second reference node, and having a pair of gates to which the pair of input signals are supplied; and a resistive element and a capacitive element formed in parallel between a pair of sources of the pair of differential transistors.

10. The receiving apparatus of claim 9, wherein at least either a resistance value of the resistive element or a capacitance value of the capacitive element is variable.

11. The receiving apparatus of claim 1, further comprising:

a signal processing device configured to process a pair of voltage signals from the receiving circuit.

12. A receiving apparatus including a receiving circuit for selectively receiving one of a plurality of input signals, the receiving circuit comprising:

a plurality of input buffer circuits, each supplied with one of the input signals and each being switchable between an output mode and a cutoff mode, each of the input buffer circuits supplying, in the output mode, to a common node a current signal corresponding to the input signal supplied to that input buffer circuit, and stopping the supply of the current signal in the cutoff mode; and an output circuit configured to convert the current signal supplied to the common node into a voltage signal, wherein each of the input buffer circuits includes a first constant current generation section configured to generate, in the output mode, a constant current in a current path going from an intermediate node to a first reference node, and stopping the generation of the constant current in the cutoff mode, the intermediate node being connected with the common node;

a voltage-to-current conversion section configured to generate, in the output mode, an input current corresponding to the input signal supplied to that input buffer circuit in a current path going from the intermediate node to a second reference node to thereby generate the current signal in a current path going from the intermediate node to the common node, and stopping the generation of the input current in the cutoff mode; and a input transistor formed in the current path going from the intermediate node of that input buffer circuit to the common node, the input transistor having a gate to which a first bias voltage is supplied, wherein the output circuit includes a second constant current generation section configured to generate a constant current in a current path going from the common node to the second reference node;

a output transistor formed in a current path going from an output node to the common node, and having a gate to which a second bias voltage is supplied, the output node being configured to output the voltage signal; and a load resistor formed in a current path going from the output node to a third reference node.

13. The receiving apparatus of claim 12, further comprising:

a signal processing device configured to process a voltage signal from the receiving circuit.

* * * * *